(12) United States Patent
Kim

(10) Patent No.: US 11,961,793 B2
(45) Date of Patent: Apr. 16, 2024

(54) SEMICONDUCTOR PACKAGE INCLUDING A REDISTRIBUTION SUBSTRATE AND A METHOD OF FABRICATING THE SAME

(71) Applicant: SAMSUNG ELECTRONICS CO., LTD., Suwon-si (KR)

(72) Inventor: Sang-Uk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 289 days.

(21) Appl. No.: 17/562,157

(22) Filed: Dec. 27, 2021

(65) Prior Publication Data
US 2022/0359358 A1 Nov. 10, 2022

(30) Foreign Application Priority Data
May 7, 2021 (KR) .................. 10-2021-0059383

(51) Int. Cl.
*H01L 23/498* (2006.01)
*H01L 23/31* (2006.01)
(Continued)

(52) U.S. Cl.
CPC .... *H01L 23/49822* (2013.01); *H01L 23/3107* (2013.01); *H01L 23/49827* (2013.01); *H01L 25/0652* (2013.01); *H01L 24/05* (2013.01); *H01L 24/13* (2013.01); *H01L 24/16* (2013.01); *H01L 2224/05624* (2013.01); *H01L 2224/05647* (2013.01); *H01L 2224/05666* (2013.01); *H01L 2224/05684* (2013.01); *H01L 2224/13111* (2013.01); *H01L 2224/13113* (2013.01); *H01L 2224/13116* (2013.01); (Continued)

(58) Field of Classification Search
CPC .................................................. H01L 23/49822
See application file for complete search history.

(56) References Cited

U.S. PATENT DOCUMENTS 7,402,901 B2   7/2008  Hatano et al.
9,048,233 B2 *  6/2015  Wu .................. H01L 21/486
(Continued)

FOREIGN PATENT DOCUMENTS

KR      10-1426654       8/2014
KR      10-2048320       1/2020

*Primary Examiner* — William A Harriston
(74) *Attorney, Agent, or Firm* — F. Chau & Associates, LLC

(57) ABSTRACT

A semiconductor package includes: a package substrate; a first re-distribution layer disposed on the package substrate; a second re-distribution layer disposed between the package substrate and the first re-distribution layer; a connection substrate interposed between the first re-distribution layer and the second re-distribution layer, wherein a connection hole penetrates the connection substrate; a first semiconductor chip mounted on a first surface of the first re-distribution layer; a first connection chip mounted on a second surface, opposite to the first surface, of the first re-distribution layer and disposed in the connection hole; a second connection chip mounted on a first surface of the second re-distribution layer and disposed in the connection hole; and a first lower semiconductor chip mounted on a second surface, opposite to the first surface, of the second re-distribution layer.

20 Claims, 14 Drawing Sheets

(51) Int. Cl.
*H01L 25/065* (2023.01)
*H01L 23/00* (2006.01)
(52) U.S. Cl.
CPC ............... *H01L 2224/13118* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2924/013* (2013.01)

(56) References Cited

U.S. PATENT DOCUMENTS

| | | |
|---|---|---|
| 10,163,856 B2 | 12/2018 | Chen et al. |
| 10,833,052 B2 | 11/2020 | Shih |
| 2016/0141234 A1 | 5/2016 | We et al. |
| 2017/0366906 A1 | 12/2017 | Lambert |
| 2018/0102311 A1* | 4/2018 | Shih .................. H01L 23/49827 |
| 2018/0358298 A1* | 12/2018 | Zhai .................... H01L 21/4853 |
| 2020/0006232 A1 | 1/2020 | Pietambaram et al. |
| 2020/0168538 A1 | 5/2020 | Ong et al. |
| 2020/0395281 A1* | 12/2020 | Chien ............... H01L 23/49822 |

\* cited by examiner

SEMICONDUCTOR PACKAGE INCLUDING A REDISTRIBUTION SUBSTRATE AND A METHOD OF FABRICATING THE SAME

CROSS-REFERENCE TO RELATED APPLICATION

This U.S. non-provisional patent application claims priority under 35 U.S.C. § 119 to Korean Patent Application No. 10-2021-0059383, filed on May 7, 2021, in the Korean Intellectual Property Office, the disclosure of which is incorporated by reference herein in its entirety.

TECHNICAL FIELD

The present inventive concept relates to a semiconductor package and a method of fabricating the same, and more particularly, to a semiconductor package including a redistribution substrate and a method of fabricating the same.

DISCUSSION OF THE RELATED ART

A semiconductor package is configured to use a semiconductor chip as a part of an electronic product. In general, the semiconductor package includes a printed circuit board (PCB) and a semiconductor chip, which is mounted on the PCB and is electrically connected to the PCB by bonding wires or bumps. Currently, semiconductor package technology is under development with the goals of miniaturization, weight reduction, and manufacturing cost reduction. In addition, as the technology is further developed in various fields such as mass storage devices, various types of semiconductor packages are becoming developed.

SUMMARY

According to an exemplary embodiment of the present inventive concept, a semiconductor package includes: a package substrate; a first re-distribution layer disposed on the package substrate; a second re-distribution layer disposed between the package substrate and the first re-distribution layer; a connection substrate interposed between the first re-distribution layer and the second re-distribution layer, wherein a connection hole penetrates the connection substrate; a first semiconductor chip mounted on a first surface of the first re-distribution layer; a first connection chip mounted on a second surface, opposite to the first surface, of the first re-distribution layer and disposed in the connection hole; a second connection chip mounted on a first surface of the second re-distribution layer and disposed in the connection hole; and a first lower semiconductor chip mounted on a second surface, opposite to the first surface, of the second re-distribution layer.

According to an exemplary embodiment of the present inventive concept, a semiconductor package includes: a package substrate; a first re-distribution layer disposed on the package substrate; a second re-distribution layer disposed between the package substrate and the first re-distribution layer; a first semiconductor chip mounted on a top surface of the first re-distribution layer; a first connection chip mounted on a bottom surface, opposite to the top surface, of the first re-distribution layer; a second connection chip mounted on a top surface of the second re-distribution layer; a first lower semiconductor chip mounted on a bottom surface, opposite to the top surface, of the second re-distribution layer and disposed between the package substrate and the second re-distribution layer; and an adhesive pattern interposed between the first connection chip and the second connection chip.

According to an exemplary embodiment of the present inventive concept, a semiconductor package includes: a package substrate; a first re-distribution layer disposed on the package substrate; a second re-distribution layer disposed between the package substrate and the first re-distribution layer; a connection substrate interposed between the first re-distribution layer and the second re-distribution layer, wherein a connection hole penetrates the connection substrate; a first semiconductor chip mounted on a first surface of the first re-distribution layer; a second semiconductor chip mounted on the first surface of the first re-distribution layer and spaced apart from the first semiconductor chip; a first connection chip mounted on a second surface, opposite to first surface, of the first re-distribution layer and disposed in the connection hole; a second connection chip mounted on a first surface of the second re-distribution layer and disposed in the connection hole; a substrate under-fill layer interposed between the package substrate and the second re-distribution layer; a first lower semiconductor chip mounted on a second surface, opposite to the first surface, of the second re-distribution layer and disposed in the substrate under-fill layer; and a second lower semiconductor chip mounted on the second surface of the second re-distribution layer and spaced apart from the first lower semiconductor chip.

DETAILED DESCRIPTION OF THE EMBODIMENTS

Exemplary embodiments of the present inventive concept will now be described more fully with reference to the accompanying drawings, in which exemplary embodiments of the present inventive concept are shown.

Figure 1:
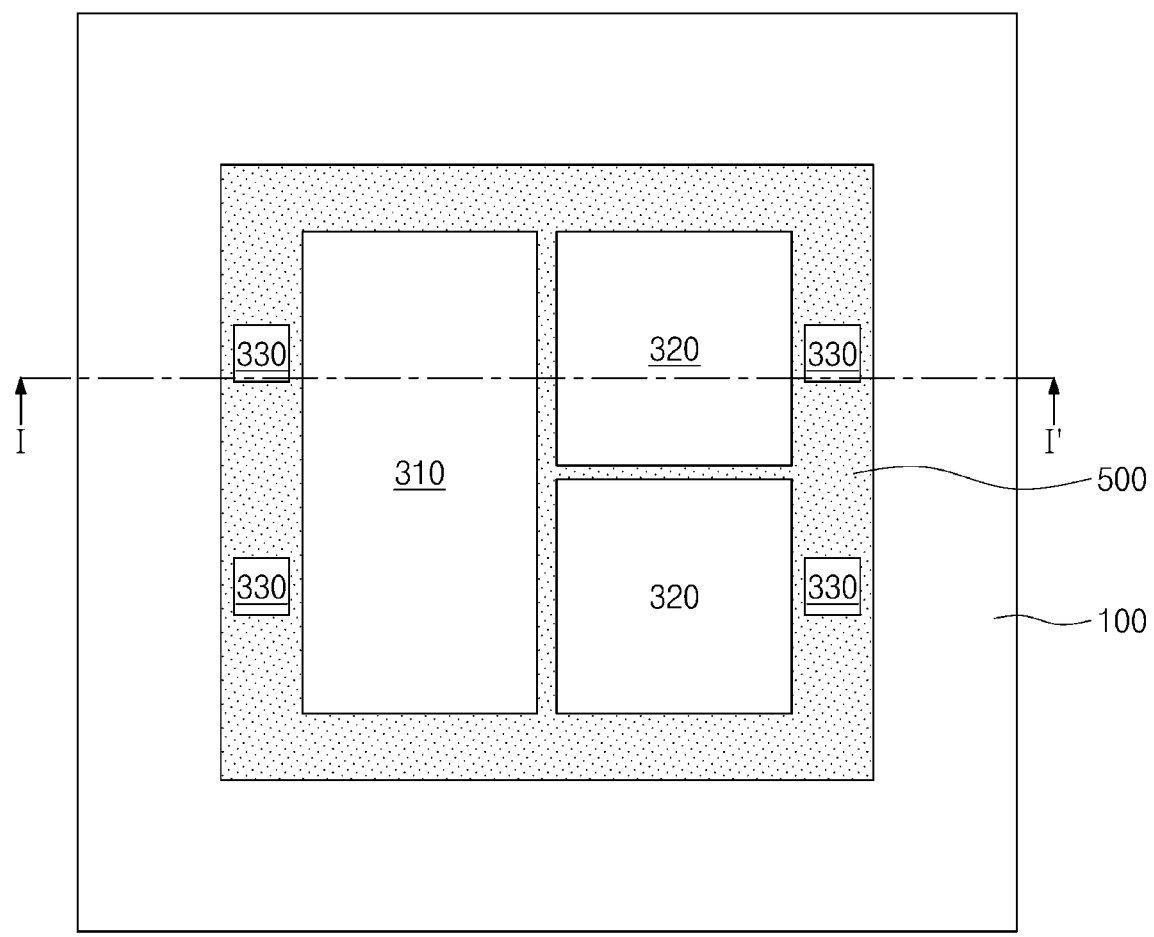
FIG. 1 is a plan view illustrating a semiconductor package according to an exemplary embodiment of the present inventive concept.
Figure 2:
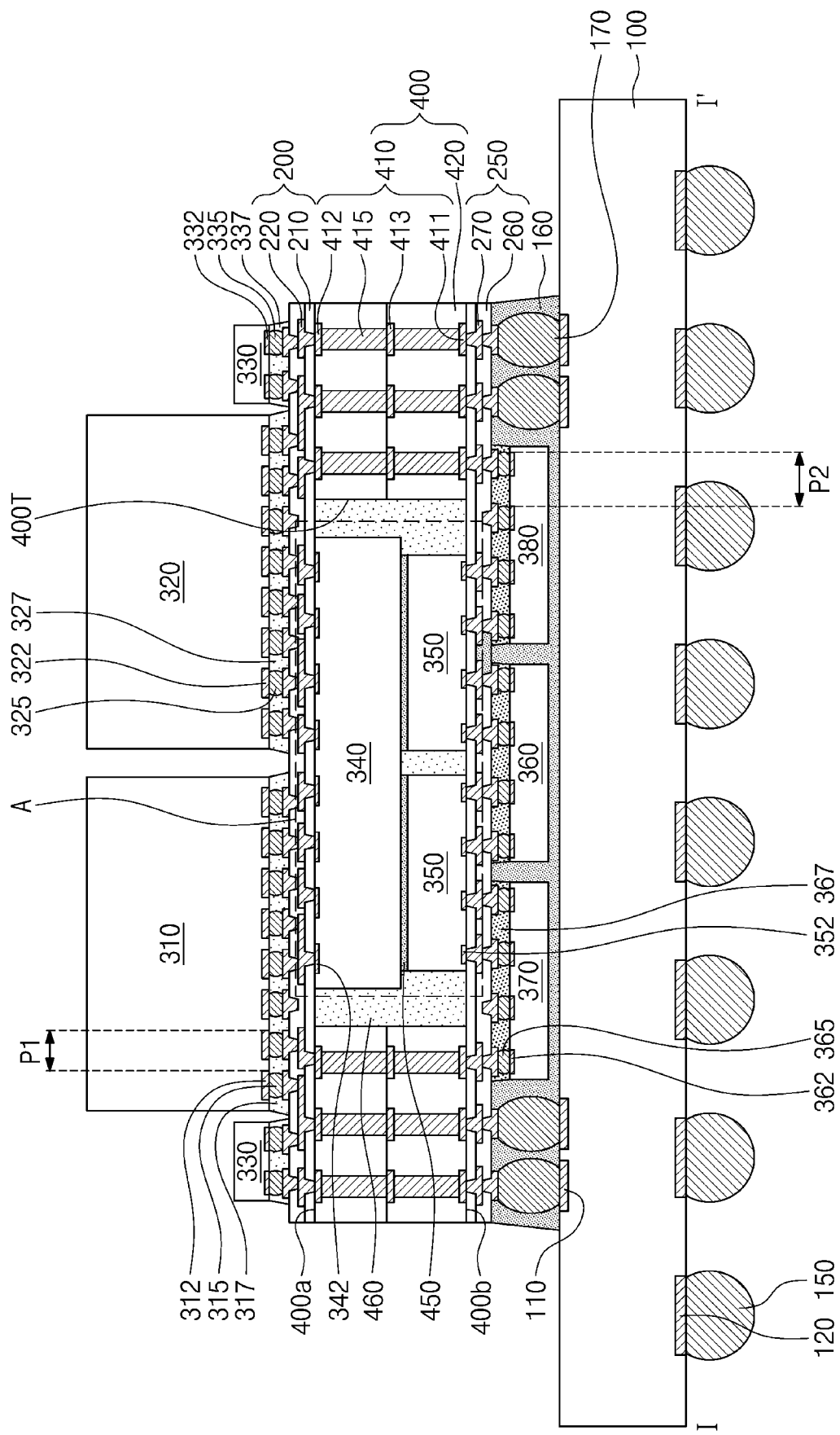
FIG. 2 is a sectional view taken along a line I-I' of FIG. 1 to illustrate a semiconductor package according to an exemplary embodiment of the present inventive concept.
Figure 3:
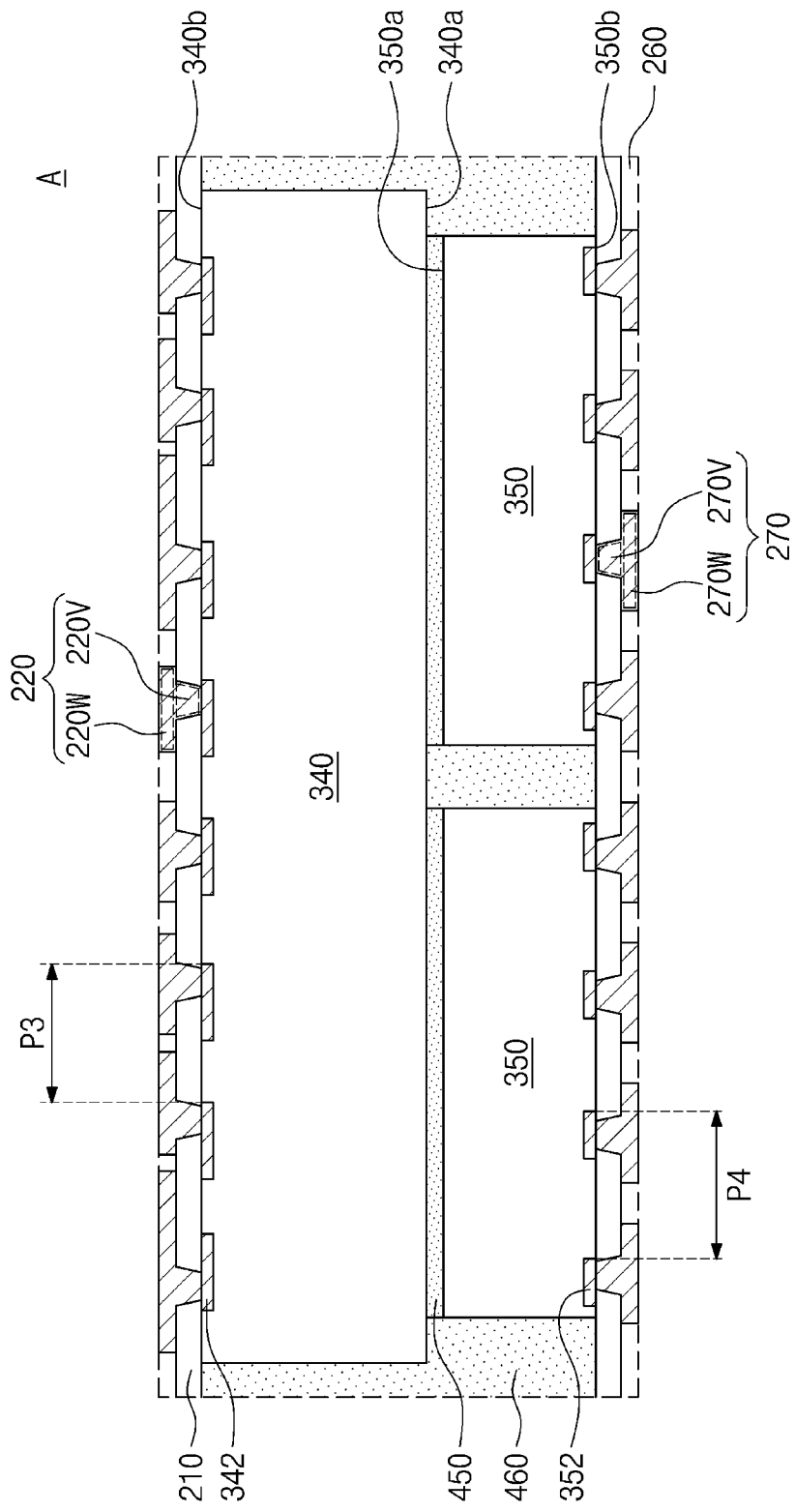
FIG. 3 is an enlarged sectional view illustrating a portion 'A' of FIG. 2.

FIG. 1 is a plan view illustrating a semiconductor package according to an exemplary embodiment of the present inventive concept. FIG. 2 is a sectional view taken along a line I-I' of FIG. 1 to illustrate a semiconductor package according to an exemplary embodiment of the present inventive concept. FIG. 3 is an enlarged sectional view illustrating a portion 'A' of FIG. 2.

Referring to FIGS. 1, 2, and 3, a semiconductor package 10 may include a package substrate 100, a first re-distribution layer 200, a second re-distribution layer 250, a connection substrate 400, a first semiconductor chip 310, a first connection chip 340, a second connection chip 350, and a first lower semiconductor chip 360.

The package substrate 100 may be provided. The package substrate 100 may be, for example, a printed circuit board (PCB). The package substrate 100 may include substrate pads 110 and terminal pads 120. The substrate pads 110 may be adjacent to a top surface of the package substrate 100, and the terminal pads 120 may be adjacent to a bottom surface of the package substrate 100. The substrate pads 110 may be exposed at the top surface of the package substrate 100. Substrate interconnection lines may be provided in the package substrate 100. The substrate pads 110 and the terminal pads 120 may be electrically connected to the substrate interconnection lines. In the present specification, the expression "two elements are electrically connected/coupled to each other" may mean that the elements are directly connected/coupled to each other or are indirectly connected/coupled to each other through another conductive element. The substrate pads 110 and the terminal pads 120 may be formed of or include at least one of conductive metal materials and may include at least one of a plurality of metallic materials (e.g., copper (Cu), aluminum (Al), tungsten (W), and titanium (Ti)).

Outer terminals 150 may be provided on the bottom surface of the package substrate 100. The outer terminals 150 may be disposed on bottom surfaces of the terminal pads 120 and may be electrically connected to the terminal pads 120, respectively. The outer terminals 150 may be coupled to an external device. Accordingly, the outer terminals 150 may be used to transmit or receive electrical signals to or from the outside to the substrate pads 110. The outer terminals 150 may include, for example, solder balls or solder bumps. The outer terminals 150 may be formed of or include at least one of a plurality of conductive metal materials (e.g., tin (Sn), lead (Pb), silver (Ag), zinc (Zn), nickel (Ni), gold (Au), copper (Cu), aluminum (Al), or bismuth (Bi)).

The first re-distribution layer 200 may be disposed on the package substrate 100. The first re-distribution layer 200 may include a first insulating layer 210 and a first redistribution pattern 220. The first insulating layer 210 may include a single layer or multiple layers. In an exemplary embodiment of the present inventive concept, an interface between two adjacent first insulating layers 210 may not be observable. The number of the first insulating layers 210 stacked is not limited to the illustrated example and may be variously changed. For example, the first insulating layer 210 may include at least one of insulating polymers or photoimageable polymers (e.g., photoimageable dielectric (PID)). The insulating polymer may include, for example, epoxy-based polymers. The photoimageable polymer may include at least one of, for example, photoimageable polyimides, polybenzoxazole (PBO), phenol-based polymers, and/or benzocyclobutene-based polymers.

The first redistribution pattern 220 may be disposed in the first insulating layer 210. In an exemplary embodiment of the present inventive concept, a plurality of the first redistribution patterns 220 may be provided. As shown in FIG. 3, each of the first redistribution patterns 220 may include a first wire portion 220W and a first via portion 220V. In the present specification, a via portion of a conductive element may be a portion that is used for a vertical interconnection, and a wire portion of the conductive element may be a portion that is used for a horizontal interconnection. The first wire portion 220W may have a long axis parallel to the top surface of the package substrate 100. A width of the first wire portion 220W may be larger than a width of the first via portion 220V. The first wire portion 220W may be disposed on the first via portion 220V. The first via portion 220V may be provided to protrude toward a bottom surface of the first re-distribution layer 200. For example, the first wire portion 220W and the first via portion 220V may be a single body. A width of the first via portion 220V at its top level may be larger than that at its bottom level. For example, the first via portion 220V may have a tapered shape. The first redistribution pattern 220 may be formed of or include at least one of conductive materials (e.g., copper (Cu), tungsten (W), and titanium (Ti)).

The first re-distribution layer 200 may be disposed between the first semiconductor chip 310 and the first connection chip 340 and may electrically connect the first semiconductor chip 310 to the first connection chip 340. The first re-distribution layer 200 may be disposed between the first semiconductor chip 310 and the connection substrate 400 and may electrically connect the first semiconductor chip 310 to the connection substrate 400. The first re-distribution layer 200 may be disposed between a second semiconductor chip 320 and the first connection chip 340 and may electrically connect the second semiconductor chip 320 to the first connection chip 340. The first re-distribution layer 200 may be disposed between the second semiconductor chip 320 and the connection substrate 400 and may electrically connect the second semiconductor chip 320 to the connection substrate 400.

The first semiconductor chip 310 may be mounted on a top surface of the first re-distribution layer 200. The first semiconductor chip 310 may include, for example, a memory chip or a logic chip. The first semiconductor chip 310 may include first chip pads 312 adjacent to a bottom surface of the first semiconductor chip 310. The first chip pads 312 of the first semiconductor chip 310 may be electrically connected to corresponding ones (e.g., the topmost ones) of the first redistribution patterns 220. The first chip pads 312 may be formed of or include at least one of a plurality of conductive materials (e.g., copper (Cu), aluminum (Al), tungsten (W), and titanium (Ti)). The first chip pads 312 may have a first pitch P1. For example, the first pitch P1 may range from about 40 μm to about 150 μm. However, the first pitch P1 might not be limited to this range and may be variously changed.

First chip bumps 315 may be interposed between the first chip pads 312 and the topmost ones of the first redistribution patterns 220. The first semiconductor chip 310 may be electrically connected to the first re-distribution layer 200 through the first chip bumps 315. The first chip bumps 315 may include, for example, solder balls or solder bumps. The first chip bumps 315 may be formed of or include at least one of a plurality of conductive materials or a plurality of metallic materials (e.g., tin (Sn), lead (Pb), silver (Ag), zinc (Zn), nickel (Ni), gold (Au), copper (Cu), aluminum (Al) and bismuth (Bi)).

First chip under-fill layer 317 may be interposed between the first semiconductor chip 310 and the first re-distribution layer 200. The first chip under-fill layer 317 may be provided to fill spaces between the first chip bumps 315 and to hermetically seal or encapsulate the first chip bumps 315. In an exemplary embodiment of the present inventive concept, the first chip under-fill layer 317 may include a non-conductive film (NCF), such as an Ajinomoto build-up film (ABF).

The second semiconductor chip 320 may be mounted on the top surface of the first re-distribution layer 200. The second semiconductor chip 320 may be disposed to be spaced apart from the first semiconductor chip 310. For example, the second semiconductor chip 320 may be horizontally spaced apart from the first semiconductor chip 310. The second semiconductor chip 320 may include a memory chip or a logic chip. The second semiconductor chip 320 may be a type different from that of the first semiconductor chip 310. The second semiconductor chip 320 may include second chip pads 322, which are provided adjacent to a bottom surface of the second semiconductor chip 320. For example, the second chip pads 322 may be disposed on the bottom surface of the second semiconductor chip 320. The second chip pads 322 of the second semiconductor chip 320 may be electrically connected to corresponding ones (e.g., the topmost ones) of the first redistribution patterns 220. The second chip pads 322 may be formed of or include at least one of a plurality of conductive materials (e.g., copper (Cu), aluminum (Al), tungsten (W), and titanium (Ti)). In an exemplary embodiment of the present inventive concept, a pitch of the second chip pads 322 may range from about 40 μm to about 150 μm. But the present inventive concept is not necessarily limited to this example, and the pitch of the second chip pads 322 may be variously changed.

Second chip bumps 325 may be interposed between the second chip pads 322 and the topmost ones of the first redistribution patterns 220. The second semiconductor chip 320 may be electrically connected to the first re-distribution layer 200 through the second chip bumps 325. The second chip bumps 325 may include solder balls or solder bumps. The second chip bumps 325 may be formed of or include at least one of a plurality of conductive materials or a plurality of metallic materials (e.g., tin (Sn), lead (Pb), silver (Ag), zinc (Zn), nickel (Ni), gold (Au), copper (Cu), aluminum (Al) and bismuth (Bi)).

A second chip under-fill layer 327 may be interposed between the second semiconductor chip 320 and the first re-distribution layer 200. The second chip under-fill layer 327 may be provided to fill spaces between the second chip bumps 325 and to hermetically seal or encapsulate the second chip bumps 325. In an exemplary embodiment of the present inventive concept, the second chip under-fill layer 327 may include a non-conductive film (NCF), such as an Ajinomoto build-up film (ABF).

A passive device 330 may be mounted on the top surface of the first re-distribution layer 200. The passive device 330 may be disposed to be spaced apart from the first and second semiconductor chips 310 and 320. For example, the passive device 330 may be horizontally spaced apart from the first and second semiconductor chips 310 and 320. For example, there may be a plurality of passive devices 330, and the first and second semiconductor chips 310 and 320 may be disposed between the plurality of passive devices 330. As an example, the passive device 330 may include a capacitor. The passive device 330 may include upper pads 332, which are provided adjacent to a bottom surface of the passive device 330. For example, the upper pads 332 may be disposed on a bottom surface of the passive device 330. The upper pads 332 of the passive device 330 may be electrically connected to corresponding ones (e.g., the topmost ones) of the first redistribution patterns 220. The upper pads 332 may be formed of or include at least one of a plurality of conductive materials (e.g., copper (Cu), aluminum (Al), tungsten (W), and titanium (Ti)).

Upper bumps 335 may be interposed between the upper pads 332 and the topmost ones of the first redistribution patterns 220. The passive device 330 may be electrically connected to the first re-distribution layer 200 through the upper bumps 335. The upper bumps 335 may include solder balls or solder bumps. The upper bumps 335 may be formed of or include at least one of a plurality of conductive materials or a plurality of metallic materials (e.g., tin (Sn), lead (Pb), silver (Ag), zinc (Zn), nickel (Ni), gold (Au), copper (Cu), aluminum (Al) and bismuth (Bi)).

An upper under-fill layer 337 may be interposed between the passive device 330 and the first re-distribution layer 200. The upper under-fill layer 337 may be provided to fill spaces between the upper bumps 335 and to hermetically seal or encapsulate the upper bumps 335. In an exemplary embodiment of the present inventive concept, the upper under-fill layer 337 may include a non-conductive film (NCF), such as an Ajinomoto build-up film (ABF).

In an exemplary embodiment of the present inventive concept, the first semiconductor chip 310, the second semiconductor chip 320, and/or the passive device 330 may be provided in plural. Planar arrangements of the first semiconductor chip 310, the second semiconductor chip 320, and the passive device 330 are not necessarily limited to the illustrated example and may be variously changed.

The second re-distribution layer 250 may be disposed on the package substrate 100. The second re-distribution layer 250 may be disposed between the package substrate 100 and the first re-distribution layer 200. The second re-distribution layer 250 may include a second insulating layer 260 and a second redistribution pattern 270. The second insulating layer 260 may include a single layer or multiple layers. In an exemplary embodiment of the present inventive concept, an interface between two adjacent ones of the second insulating layers 260 may not be observable. The number of the second insulating layers 260 stacked is not necessarily limited to the illustrated example and may be variously changed. The second insulating layer 260 may be formed of or include a material that is different from that of the first insulating layer 210. The second insulating layer 260 may include at least one of insulating polymers or photoimageable polymers (e.g., photoimageable dielectric (PID)). The insulating polymer may include, for example, epoxy-based polymers. The photoimageable polymer may include at least one of, for example, photoimageable polyimides, polybenzoxazole (PBO), phenol-based polymers, and/or benzocyclobutene-based polymers.

The second redistribution pattern 270 may be disposed in the second insulating layer 260. In an exemplary embodiment of the present inventive concept, a plurality of the second redistribution patterns 270 may be provided. As shown in FIG. 3, each of the second redistribution patterns 270 may include a second wire portion 270W and a second via portion 270V. The second wire portion 270W may have a long axis parallel to the top surface of the package substrate 100. A width of the second wire portion 270W may be larger than a width of the second via portion 270V. The second via portion 270V may be disposed on the second wire portion 270W. The second via portion 270V may be provided to protrude toward a top surface of the second re-distribution layer 250. For example, the second via portion 270V and the second wire portion 270W may be a single body. A width of the second via portion 270V at its top level may be smaller than that at its bottom level. For example, the second via portion 270V may have a tapered shape. The second redistribution pattern 270 may be formed of or include at least one of a plurality of conductive materials (e.g., copper (Cu), tungsten (W), and titanium (Ti)).

The second re-distribution layer 250 may be disposed between first to third lower semiconductor chips 360, 370, and 380 and the second connection chip 350 to electrically connect the first to third lower semiconductor chips 360, 370, and 380 to the second connection chip 350. The second re-distribution layer 250 may be disposed between the second lower semiconductor chip 370 and the connection substrate 400 to electrically connect the second lower semiconductor chip 370 to the connection substrate 400. The second re-distribution layer 250 may be disposed between the third lower semiconductor chip 380 and the connection substrate 400 to electrically connect the third lower semiconductor chip 380 to the connection substrate 400. For example, the first lower semiconductor chip 360 might not be electrically connected to the connection substrate 400.

The connection substrate 400 may be disposed on the package substrate 100. The connection substrate 400 may be interposed between the first re-distribution layer 200 and the second re-distribution layer 250. The first re-distribution layer 200 and the second re-distribution layer 250 may be electrically connected to each other through the connection substrate 400. The connection substrate 400 may have a connection hole 400T, which is formed to penetrate the connection substrate 400. For example, the connection hole 400T may be formed in a center region of the connection substrate 400, when viewed in a plan view. The connection hole 400T may be formed to expose a portion of the bottom surface of the first re-distribution layer 200 and a portion of the top surface of the second re-distribution layer 250. For example, the first re-distribution layer 200, the connection substrate 400, and the second re-distribution layer 250 may be referred to as an interposer substrate.

The connection substrate 400 may include a conductive structure 410 and a base layer 420. The base layer 420 may include a single layer or a plurality of stacked layers. The base layer 420 may include an insulating material and, for example, may be formed of or include at least one of a plurality of carbon-based materials (e.g., graphite or graphene), ceramics, and/or polymers (e.g., nylon, polycarbonate, or polyethylene). The connection hole 400T may be formed to penetrate the base layer 420.

The conductive structure 410 may be provided in the base layer 420. In an exemplary embodiment of the present inventive concept, a plurality of the conductive structures 410 may be provided. The conductive structures 410 may be coupled to corresponding ones (e.g., the bottommost ones) of the first redistribution patterns 220 and corresponding ones (e.g., the topmost ones) of the second redistribution patterns 270. For example, the conductive structures 410 may electrically connect the first redistribution patterns 220 to the second redistribution patterns 270. As an example, the conductive structure 410 may be a metal pillar. The conductive structure 410 may be formed of or include at least one of a plurality of conductive materials (e.g., copper (Cu), aluminum (Al), gold (Au), lead (Pb), stainless steel (SUS), silver (Ag), iron (Fe), and alloys thereof).

The conductive structure 410 may include a first pad 411, a second pad 412, a third pad 413, and vias 415. The first pad 411 may be exposed near a bottom surface of the connection substrate 400. The first pad 411 may be coupled to a corresponding one of the vias 415. The second pad 412 may be exposed near a top surface of the connection substrate 400. The second pad 412 may be coupled to corresponding another of the vias 415. The third pad 413 may be interposed between the base layers 420. The vias 415 may be provided to penetrate the base layers 420 and may be coupled to the third pad 413. The second pad 412 may be electrically connected to the first pad 411 through the vias 415 and the third pad 413. The first pad 411 may be coupled to the topmost corresponding one of the second redistribution patterns 270. The second pad 412 may be coupled to the bottommost corresponding one of the first redistribution patterns 220.

The first connection chip 340 may be mounted on the bottom surface of the first re-distribution layer 200. The first connection chip 340 may be disposed in the connection hole 400T of the connection substrate 400. The first connection chip 340 may be a silicon-containing chip (e.g., an interconnect chip or a bridge chip). The first connection chip 340 may include a first surface 340a (e.g., a top surface of the first connection chip 340) adjacent to the second re-distribution layer 250 and a second surface 340b (e.g., a bottom surface of the first connection chip 340) adjacent to the first re-distribution layer 200. The second surface 340b of the first connection chip 340 (e.g., the bottom surface of the first connection chip 340) may face bottom surfaces of the first and second semiconductor chips 310 and 320. When viewed in a plan view, the first connection chip 340 may be disposed between the first and second semiconductor chips 310 and 320. As an example, a portion of the first connection chip 340 may be vertically overlapped with a portion of the first semiconductor chip 310, and another portion of the first connection chip 340 may be vertically overlapped with a portion of the second semiconductor chip 320. The first and second semiconductor chips 310 and 320 may be electrically connected to each other through the first connection chip 340. The number of the first connection chips 340 is not necessarily limited to the illustrated example and may be two or more.

The first connection chip 340 may include first connection pads 342, which are provided adjacent to the second surface 340b of the first connection chip 340. The first connection pads 342 may be exposed near the second surface 340b of the first connection chip 340. The first connection pads 342 may be electrically connected to corresponding ones (e.g., the bottommost ones) of the first redistribution patterns 220. As an example, the first connection pads 342 may be in contact with the bottommost corresponding ones of the first redistribution patterns 220. The first connection pads 342 may be formed of or include at least one of a plurality of conductive materials (e.g., copper (Cu)). As shown in FIG. 3, the first connection pads 342 may have a third pitch P3. For example, the third pitch P3 may range from about 40 μm to about 150 μm. However, the third pitch P3 might not be necessarily limited to this range and may be variously changed.

The second connection chip 350 may be mounted on the top surface of the second re-distribution layer 250. The second connection chip 350 may be disposed in the connection hole 400T of the connection substrate 400. For example, the second connection chip 350 may be a silicon-containing chip (e.g., an interconnect chip or a bridge chip). The second connection chip 350 may include a first surface 350a (e.g., a top surface of the second connection chip 350) facing the first re-distribution layer 200 and a second surface 350b (e.g., a bottom surface of the second connection chip 350) facing and adjacent to the second re-distribution layer 250. In an exemplary embodiment of the present inventive concept, a plurality of the second connection chips 350 may be provided. The first surface 350a of the second connection chips 350 (e.g., top surface of the second connection chips 350) may face the first surface 340a of the first connection chip 340 (e.g., the bottom surface of the first connection chip 340). The second connection chip 350 may be vertically spaced apart from the first connection chip 340. When viewed in a plan view, the second connection chips 350 may be disposed between the first to third lower semiconductor chips 360, 370, and 380. As an example, a portion of the second connection chip 350 may be vertically overlapped with a portion of the first lower semiconductor chip 360, and another portion of the second connection chip 350 may be vertically overlapped with a portion of the second or third lower semiconductor chip 370 or 380. The first to third lower semiconductor chips 360, 370, and 380 may be electrically connected to each other through the second connection chip 350. The number of the second connection chips 350 is not necessarily limited to the illustrated example and may be variously changed.

The second connection chip 350 may include second connection pads 352, which are provided adjacent to the second surface 350b of the second connection chip 350. The second connection pads 352 may be exposed near the second surface 350b of the second connection chip 350. The second connection pads 352 may be electrically connected to corresponding ones (e.g., the topmost ones) of the second redistribution patterns 270. As an example, the second connection pads 352 may be in contact with the topmost corresponding ones of the second redistribution patterns 270. The second connection pads 352 may be formed of or include at least one of a plurality of conductive materials (e.g., copper (Cu)). As shown in FIG. 3, the second connection pads 352 may have a fourth pitch P4. For example, the fourth pitch P4 may range from about 100 μm to about 300 μm. However, the fourth pitch P4 might not be necessarily limited to this range and may be variously changed.

The second surface 340b of the first connection chip 340 may be located at substantially the same level as a top surface 400a of the connection substrate 400. For example, the second surface 340b of the first connection chip 340 may be coplanar with the top surface 400a of the connection substrate 400. The second surface 350b of the second connection chip 350 may be located at substantially the same level as a bottom surface 400b of the connection substrate 400. For example, the second surface 350b of the second connection chip 350 may be coplanar with the bottom surface 400b of the connection substrate 400. In the present specification, the level may mean a vertical height from the top surface of the package substrate 100.

An adhesive pattern 450 may be interposed between the first connection chip 340 and the second connection chip 350. The adhesive pattern 450 may cover the first surface 350a of the second connection chip 350. The first connection chip 340 may be attached to the second connection chips 350 by the adhesive pattern 450. As an example, the adhesive pattern 450 may be formed of or include an insulating polymer.

A connection mold layer 460 may be provided in the connection hole 400T of the connection substrate 400. The connection mold layer 460 may be interposed between the first re-distribution layer 200 and the second re-distribution layer 250. The connection mold layer 460 may cover a side surface of the first connection chip 340 and side surfaces of the second connection chips 350. The connection mold layer 460 may cover an inner side surface of the connection substrate 400. The connection mold layer 460 may include an insulating polymer (e.g., epoxy molding compound (EMC)). For example, an upper surface of the connection mold layer 460 may be coplanar with the second surface 340b of the first connection chip 340.

The first lower semiconductor chip 360 may be mounted on a bottom surface of the second re-distribution layer 250.

The first lower semiconductor chip 360 may be disposed between the package substrate 100 and the second re-distribution layer 250. The first lower semiconductor chip 360 may include an active device or a passive device. As an example, the active device may include a memory chip or a logic chip. As an example, the passive device may include a capacitor. When viewed in a plan view, the first lower semiconductor chip 360 may be disposed between the second connection chips 350. In other words, a portion of the first lower semiconductor chip 360 may be vertically overlapped with one of the second connection chips 350, and another portion of the first lower semiconductor chip 360 may be vertically overlapped with another one of the second connection chips 350.

The second lower semiconductor chip 370 may be mounted on the bottom surface of the second re-distribution layer 250. The second lower semiconductor chip 370 may be disposed between the package substrate 100 and the second re-distribution layer 250. The second lower semiconductor chip 370 may be spaced apart from the first lower semiconductor chip 360. For example, the second lower semiconductor chip 370 may be horizontally spaced apart from the first lower semiconductor chip 360. The second lower semiconductor chip 370 may include an active device or a passive device. As an example, the active device may include a memory chip or a logic chip. As an example, the passive device may include a capacitor. A portion of the second lower semiconductor chip 370 may be vertically overlapped with the second connection chip 350, and another portion of the second lower semiconductor chip 370 may be vertically overlapped with the connection substrate 400.

The third lower semiconductor chip 380 may be mounted on the bottom surface of the second re-distribution layer 250. The third lower semiconductor chip 380 may be disposed between the package substrate 100 and the second re-distribution layer 250. The third lower semiconductor chip 380 may be spaced apart from the second lower semiconductor chip 370 with the first lower semiconductor chip 360 interposed therebetween. For example, the third lower semiconductor chip 380 may be horizontally spaced apart from the first lower semiconductor chip 360 and the second lower semiconductor chip 370. The third lower semiconductor chip 380 may include an active device or a passive device. As an example, the active device may include a memory chip or a logic chip. As an example, the passive device may include a capacitor. A portion of the third lower semiconductor chip 380 may be vertically overlapped with the second connection chip 350, and another portion of the third lower semiconductor chip 380 may be vertically overlapped with the connection substrate 400.

Bottom surfaces of the first to third lower semiconductor chips 360, 370, and 380 may face the second surface 350b of the second connection chips 350 (e.g., the bottom surface of the second connection chips 350). However, the present inventive concept is not limited thereto, and for example, top surfaces of the first to third lower semiconductor chips 360, 370, and 380 may face the second surface 350b of the second connection chips 350. The first to third lower semiconductor chips 360, 370, and 380 may be vertically spaced apart from the package substrate 100 and may not be in contact with the package substrate 100. At least one of the first, second or third lower semiconductor chips 360, 370, or 380 may be electrically connected to at least one of the first or second semiconductor chips 310 or 320 through at least one of the connection substrate 400 or the first and second connection chips 340 and 350.

Each of the first to third lower semiconductor chips 360, 370, and 380 may include lower pads 362, which are provided adjacent to a bottom surface thereof. The lower pads 362 may be electrically connected to corresponding ones (e.g., the bottommost ones) of the second redistribution patterns 270. The lower pads 362 may be formed of or include at least one of a plurality of conductive materials (e.g., copper (Cu), aluminum (Al), tungsten (W), and titanium (Ti)).

The lower pads 362 may have a second pitch P2. For example, the second pitch P2 may range from about 100 μm to about 300 μm. However, the second pitch P2 may not be necessarily limited to this range and may be variously changed.

Lower bumps 365 may be interposed between the first lower semiconductor chip 360 and the corresponding bottommost ones of the second redistribution patterns 270, between the second lower semiconductor chip 370 and the corresponding bottommost ones of the second redistribution patterns 270, and between the third lower semiconductor chip 380 and the corresponding bottommost ones of the second redistribution patterns 270. The first to third lower semiconductor chips 360, 370, and 380 may be electrically connected to the second re-distribution layer 250 through the lower bumps 365. The lower bumps 365 may include solder balls or solder bumps. The lower bumps 365 may be formed of or include at least one of a plurality of conductive materials or a plurality of metallic materials (e.g., tin (Sn), lead (Pb), silver (Ag), zinc (Zn), nickel (Ni), gold (Au), copper (Cu), aluminum (Al) and bismuth (Bi)).

A lower under-fill layer 367 may be interposed between the first lower semiconductor chip 360 and the second re-distribution layer 250, between the second lower semiconductor chip 370 and the second re-distribution layer 250, and between the third lower semiconductor chip 380 and the second re-distribution layer 250. The lower under-fill layer 367 may be provided to fill spaces between the lower bumps 365 and to hermetically seal or encapsulate the lower bumps 365. In an exemplary embodiment of the present inventive concept, the lower under-fill layer 367 may include a non-conductive film (NCF), such as an Ajinomoto build-up film (ABF).

Substrate bumps 170 may be interposed between the package substrate 100 and the second re-distribution layer 250. The package substrate 100 and the second re-distribution layer 250 may be electrically connected to each other through the substrate bumps 170. Each of the substrate pads 110 may be electrically connected to a corresponding one of the bottommost ones of the second redistribution patterns 270 through a corresponding one of the substrate bumps 170. The substrate bumps 170 may be formed of or include at least one of a plurality of conductive materials and may include solder balls or solder bumps. For example, the substrate bumps 170 may be formed of or include at least one of a plurality of conductive materials or a plurality of metallic materials (e.g., tin (Sn), lead (Pb), silver (Ag), zinc (Zn), nickel (Ni), gold (Au), copper (Cu), aluminum (Al) and bismuth (Bi)). A pitch of the substrate bumps 170 may be smaller than a pitch of the outer terminals 150.

A substrate under-fill layer 160 may be interposed between the package substrate 100 and the second re-distribution layer 250. The substrate under-fill layer 160 may be provided to fill spaces between the substrate bumps 170 and to hermetically seal or encapsulate the substrate bumps 170. The first to third lower semiconductor chips 360, 370, and 380 may be disposed in the substrate under-fill layer 160. The substrate under-fill layer 160 may cover the first to third lower semiconductor chips 360, 370, and 380.

In an exemplary embodiment of the present inventive concept, the substrate under-fill layer 160 may include a non-conductive film (NCF), such as an Ajinomoto build-up film (ABF).

Planar arrangements of the first and second semiconductor chips 310 and 320, the passive device 330, the first connection chip 340, the second connection chip 350, and the first to third lower semiconductor chips 360, 370, and 380 are not necessarily limited to the illustrated example and may be variously changed.

According to an exemplary embodiment of the present inventive concept, since the first and second connection chips 340 and 350, which are opposite to each other, are disposed between the first and second re-distribution layers 200 and 250, the first and second semiconductor chips 310 and 320 may be mounted on the top surface of the first re-distribution layer 200, and the first to third lower semiconductor chips 360, 370, and 380 may be mounted on the bottom surface of the second re-distribution layer 250. Accordingly, it may be possible to reduce a length of an electric connection path between the semiconductor chips and thereby to increase a signal transmission speed and stability of the signal transmission. As a result, it may be possible to improve electric characteristics of a semiconductor package.

According to an exemplary embodiment of the present inventive concept, since a length of an electric connection path between a semiconductor chip and a passive device is reduced, it may be possible to effectively remove a noise of a power signal or an input signal and to improve a power integrity property of a semiconductor package.

According to an exemplary embodiment of the present inventive concept, it may be possible to increase a degree of freedom in disposing semiconductor chips and to mount semiconductor chips in a high density, and thus, a highly-integrated and small semiconductor package may be provided.

FIGS. 4 to 11 are sectional views illustrating a method of fabricating a semiconductor package according to an exemplary embodiment of the present inventive concept. To the extent that various elements are not described in detail with respect to FIGS. 4 to 11, it may be assumed that these elements are at least similar to corresponding elements described in detail elsewhere within the instant application. Corresponding elements may have similar or identical reference numerals or may otherwise be recognizable as corresponding based on context.

Figure 4:
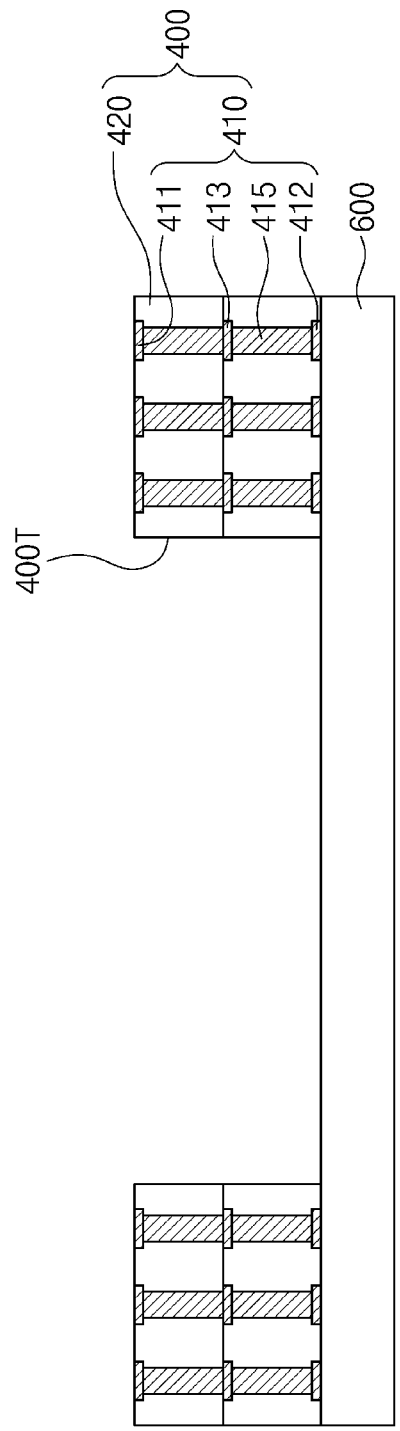
FIGS. 4, 5, 6, 7, 8, 9, 10 and 11 are sectional views illustrating a method of fabricating a semiconductor package according to an exemplary embodiment of the present inventive concept.

Referring to FIG. 4, the connection substrate 400 may be provided on a carrier substrate 600. For example, the carrier substrate 600 may be formed of or include at least one of a plurality of polymeric materials. As an example, the carrier substrate 600 may include an adhesive tape, and thus, the connection substrate 400 may be attached to the carrier substrate 600.

The connection substrate 400 may have the connection hole 400T, which is formed to penetrate the connection substrate 400. The connection hole 400T may be formed to expose the carrier substrate 600. The connection substrate 400 may include the conductive structures 410 and the base layer 420. The base layer 420 may include a single layer or a plurality of stacked layers. The conductive structures 410 may be provided in the base layer 420. The conductive structure 410 may include the first pad 411, the second pad 412, the third pad 413, and the vias 415. The first pad 411 may be coupled to a corresponding one of the vias 415. The second pad 412 may be exposed near the top surface of the connection substrate 400. The second pad 412 may be coupled to a corresponding one of the vias 415. The third pad 413 may be interposed between the base layers 420. The vias 415 may be provided to penetrate the base layers 420 and may be coupled to the third pad 413. The third pad 413 may be disposed between vertically stacked vias 415. The connection substrate 400 and the first and second re-distribution layers 200 and 250 to be described below may be fabricated in a panel level. For convenience in description, the following description will be given based on a single package to be cut by a subsequent sawing process.

Figure 5:
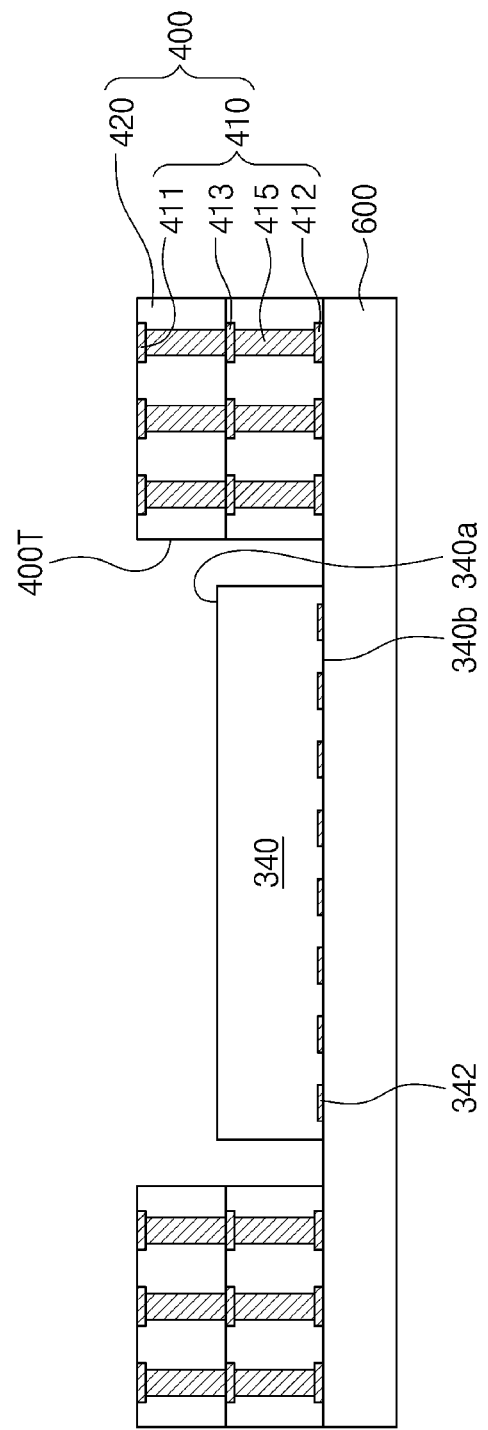

Referring to FIG. 5, the first connection chip 340 may be provided on the carrier substrate 600. The first connection chip 340 may be disposed in the connection hole 400T of the connection substrate 400. The first connection chip 340 may include the first connection pads 342, which are provided adjacent to the second surface 340b of the first connection chip 340.

Figure 6:
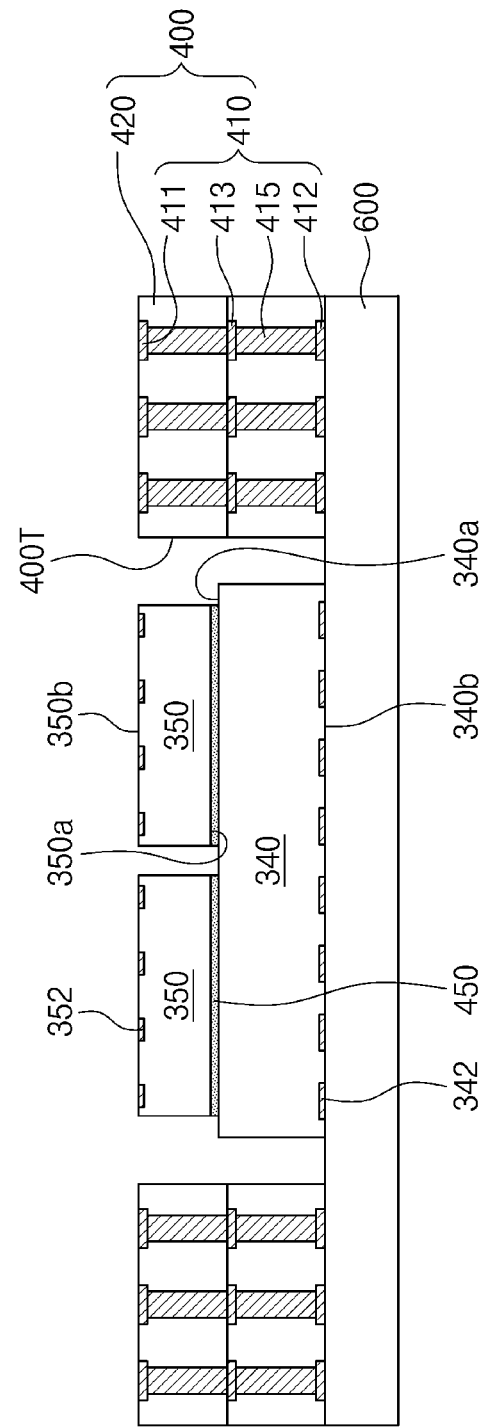

Referring to FIG. 6, the second connection chips 350 may be provided on the carrier substrate 600. The second connection chips 350 may be disposed in the connection hole 400T of the connection substrate 400. The second connection chips 350 may be disposed on the first surface 340a of the first connection chip 340. The adhesive pattern 450 may be interposed between the first surface 340a of the first connection chip 340 and the first surface 350a of the second connection chips 350. Each of the second connection chips 350 may include the second connection pads 352, which are provided adjacent to the second surface 350b of the second connection chip 350. The second connection pads 352 may be exposed near the second surface 350b of the second connection chip 350.

Figure 7:
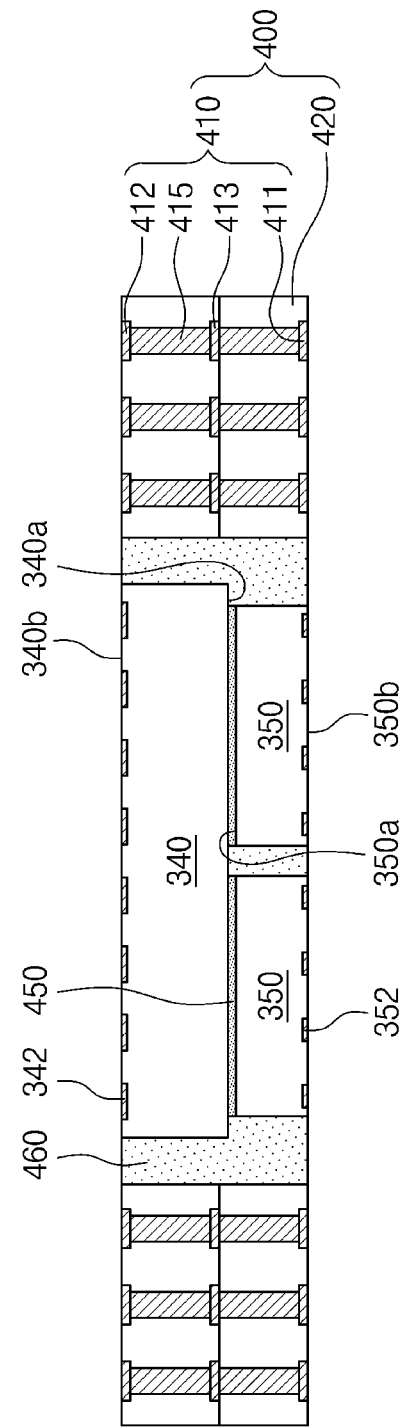

Referring to FIG. 7, the connection mold layer 460 may be formed on the carrier substrate 600 to cover the inner side surfaces of the connection substrate 400, the side surfaces of the first connection chip 340, and the side surfaces of the second connection chips 350.

The carrier substrate 600 may be inverted such that the second surface 340b of the first connection chip 340 is oriented in an upward direction. The first connection pads 342 of the first connection chip 340 may be exposed by removing the carrier substrate 600. In addition, for consistency in description, a top surface, a bottom surface, an upper portion, and a lower portion of each element will be based on the structure shown in FIG. 2.

Figure 8:
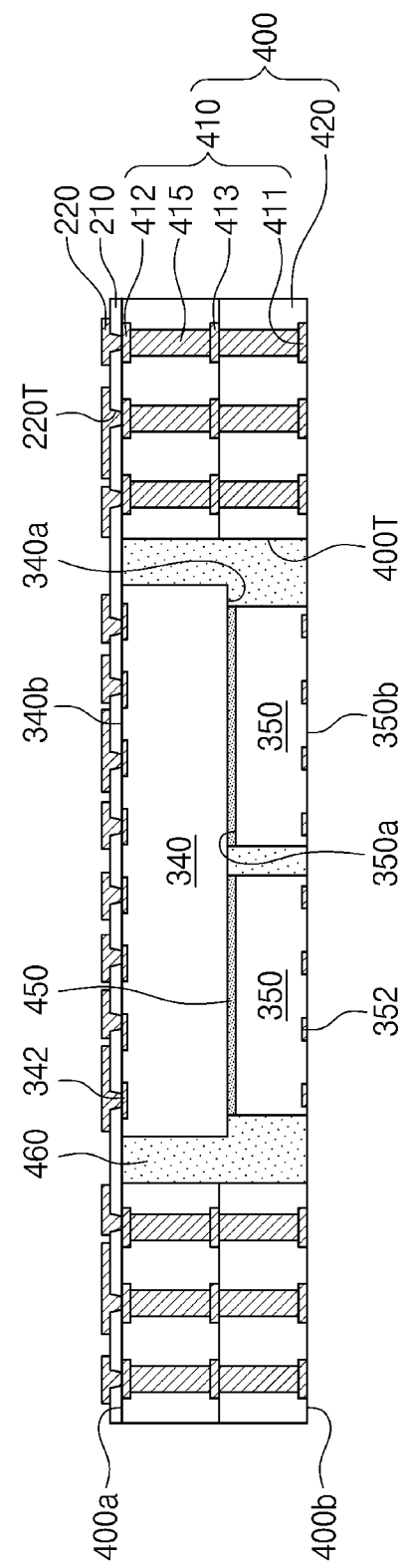

Referring to FIG. 8, the first insulating layer 210 may be formed on the second surface 340b of the first connection chip 340. The first insulating layer 210 may cover the top surface 400a of the connection substrate 400, the second surface 340b of the first connection chip 340, and the top surface of the connection mold layer 460. The first insulating layer 210 may be patterned to form a plurality of first holes 220T in the first insulating layer 210. The first holes 220T may be formed to expose the first connection pads 342 and the second pads 412. The patterning of the first insulating layer 210 may include performing an exposure process and a developing process. As an example, each of the first holes 220T may have a tapered shape.

The first redistribution patterns 220 may be formed on the first insulating layer 210. As an example, the formation of the first redistribution pattern 220 may include forming a seed layer on the first insulating layer 210, performing an electroplating process, in which the seed layer is used as an electrode, to form a conductive layer, and patterning the seed layer and the conductive layer. The conductive layer may be formed of or include a metallic material (e.g., copper (Cu)).

The first redistribution pattern 220 may include a first via portion, which is provided in the first hole 220T, and a first wire portion, which is provided on the first insulating layer 210. For example, the first via portion and the first wire portion are a single body.

Figure 9:
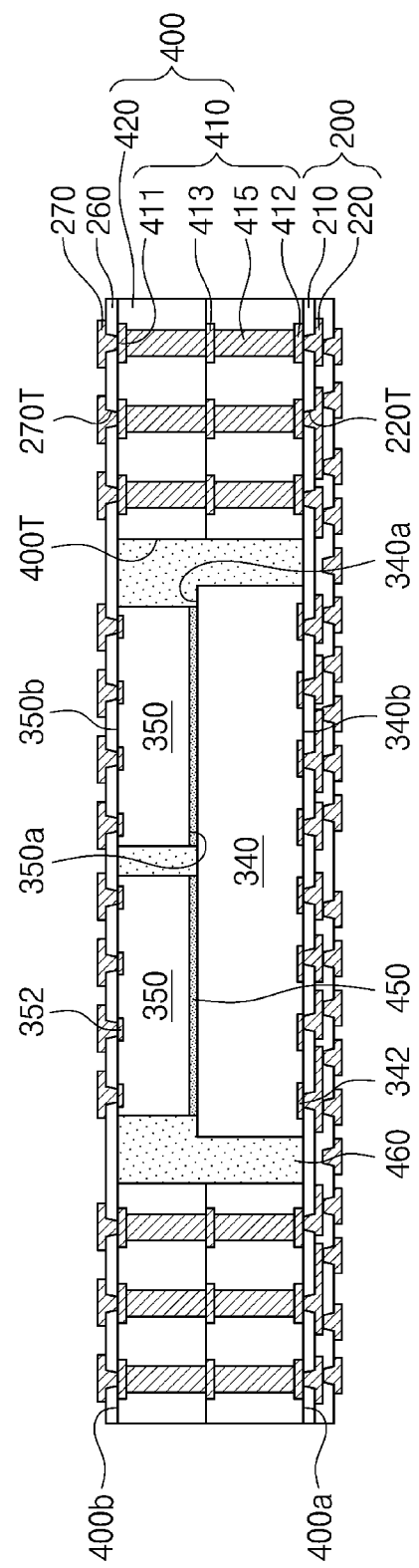

Referring to FIG. 9, the processes of forming the first insulating layer 210 and the first redistribution pattern 220 may be repeatedly performed. Accordingly, the first re-distribution layer 200, in which a plurality of the first insulating layers 210 and a plurality of the first redistribution patterns 220 are stacked, may be formed, according to an exemplary embodiment of the present inventive concept. The first re-distribution layer 200 may be inverted such that the second surface 350b of the second connection chip 350 is oriented in an upward direction.

The second insulating layer 260 may be formed on the second surface 350b of the second connection chip 350. The second insulating layer 260 may cover the bottom surface 400b of the connection substrate 400 and the second surface 350b of the second connection chip 350. The second insulating layer 260 may be patterned to form a plurality of second holes 270T in the second insulating layer 260. The second holes 270T may be formed to expose the second connection pads 352 and the first pads 411. The patterning of the second insulating layer 260 may include performing an exposure process and a developing process. As an example, each of the second holes 270T may have a tapered shape. However, the present inventive concept is not necessarily limited thereto, and for example, each of the second holes 270T may have a cylindrical shape.

The second redistribution patterns 270 may be formed on the second insulating layer 260. As an example, the formation of the second redistribution pattern 270 may include forming a seed layer on the second insulating layer 260, performing an electroplating process, in which the seed layer is used as an electrode, to form a conductive layer, and patterning the seed layer and the conductive layer. The conductive layer may be formed of or include a metallic material (e.g., copper (Cu)). The second redistribution pattern 270 may include a first via portion provided in the second hole 270T and a first wire portion provided on the second insulating layer 260.

Figure 10:
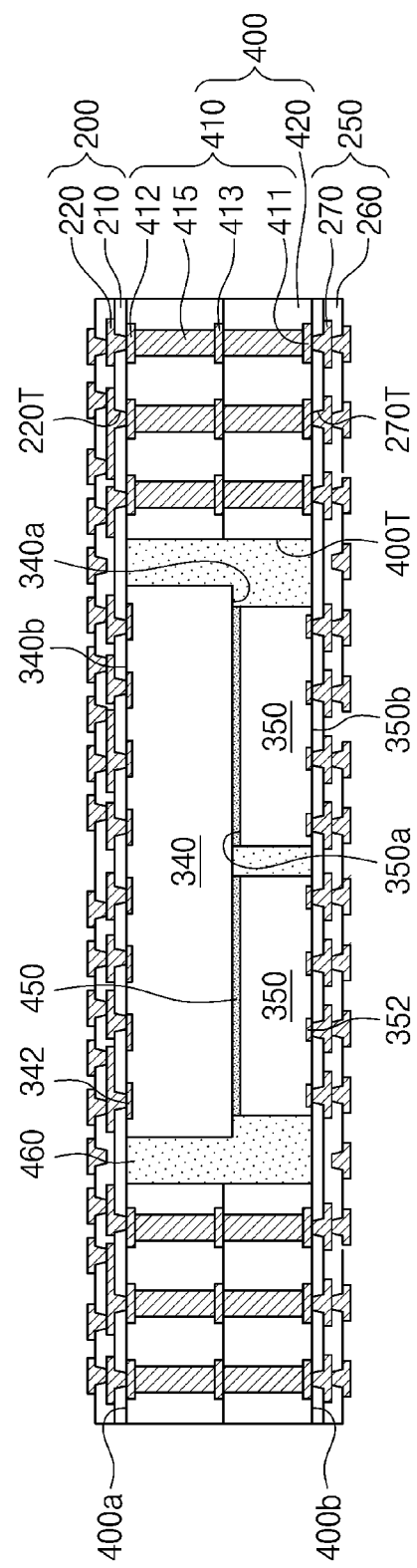

Referring to FIG. 10, the processes of forming the second insulating layer 260 and the second redistribution pattern 270 may be repeatedly performed. Accordingly, the second re-distribution layer 250, in which a plurality of the second insulating layers 260 and a plurality of the second redistribution patterns 270 are stacked, may be formed. The second re-distribution layer 250 may be inverted such that the second surface 340b of the first connection chip 340 is oriented in an upward direction.

Figure 11:
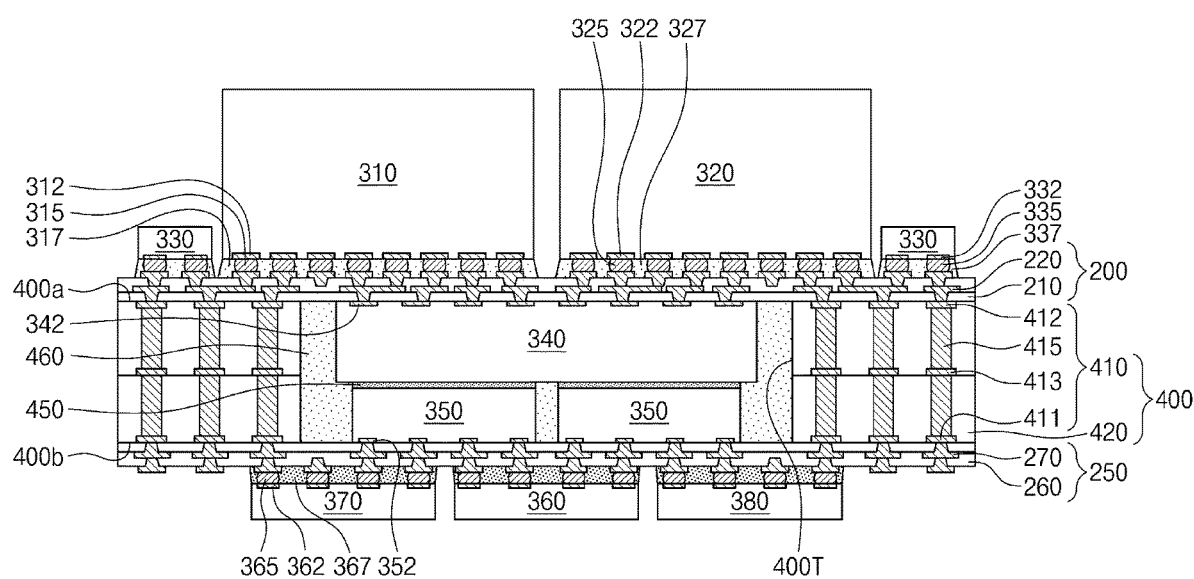

Referring to FIG. 11, the first semiconductor chip 310, the second semiconductor chip 320, and the passive device 330 may be mounted on the top surface of the first re-distribution layer 200. The first to third lower semiconductor chips 360, 370, and 380 may be mounted on the bottom surface of the second re-distribution layer 250.

The first semiconductor chip 310 may include the first chip pads 312, which are provided adjacent to the bottom surface of the first semiconductor chip 310. For example, the first chip pads 312 may be formed on the bottom surface of the first semiconductor chip 310. The mounting of the first semiconductor chip 310 may include forming first chip bumps 315 between the first chip pads 312 and the corresponding topmost ones of the first redistribution patterns 220. The second semiconductor chip 320 may include the second chip pads 322, which are provided adjacent to the bottom surface of the second semiconductor chip 320. For example, the second chip pads 322 may be formed on the bottom surface of the second semiconductor chip 320. The mounting of the second semiconductor chip 320 may include forming the second chip bumps 325 between the second chip pads 322 and the corresponding topmost ones of the first redistribution patterns 220. The passive device 330 may include the upper pads 332, which are provided adjacent to the bottom surface of the passive device 330. For example, the upper pads 332 may be formed on the bottom surface of the passive device 330. The mounting of the passive device 330 may include forming the upper bumps 335 between the upper pads 332 and the corresponding topmost ones of the first redistribution patterns 220. Each of the first to third lower semiconductor chips 360, 370, and 380 may include lower pads 362, which are provided adjacent to a bottom surface thereof. For example, the lower pads 362 may be formed on the bottom surface of each of the first to third lower semiconductor chips 360, 370, and 380. The mounting of the first to third lower semiconductor chips 360, 370, and 380 may include forming the lower bumps 365 between the lower pads 362 and the corresponding bottommost ones of the second redistribution patterns 270. The mounting order of the first and second semiconductor chip 310 and 320, the first to third lower semiconductor chips 360, 370, and 380, and the passive device 330 may not be necessarily limited to the afore-described example and may be variously changed.

The first chip under-fill layer 317 may be formed between the first semiconductor chip 310 and the first re-distribution layer 200. The second chip under-fill layer 327 may be formed between the second semiconductor chip 320 and the first re-distribution layer 200. The upper under-fill layer 337 may be formed between the passive device 330 and the first re-distribution layer 200. The lower under-fill layer 367 may be formed between the first lower semiconductor chip 360 and the second re-distribution layer 250, between the second lower semiconductor chip 370 and the second re-distribution layer 250, and between the third lower semiconductor chip 380 and the second re-distribution layer 250. The forming order of the first chip under-fill layer 317, the second chip under-fill layer 327, the upper under-fill layer 337, and the lower under-fill layer 367 may not be necessarily limited to the afore-described example and may be variously changed.

Referring back to FIGS. 1 and 2, a sawing process may be performed on the first re-distribution layer 200, the second re-distribution layer 250, and the connection substrate 400 to form preliminary semiconductor packages which are separated from each other. The preliminary semiconductor package may be provided on the package substrate 100. The substrate bumps 170 may be formed between the package substrate 100 and the second re-distribution layer 250. The substrate under-fill layer 160 may be formed between the package substrate 100 and the second re-distribution layer 250.

Figure 12:
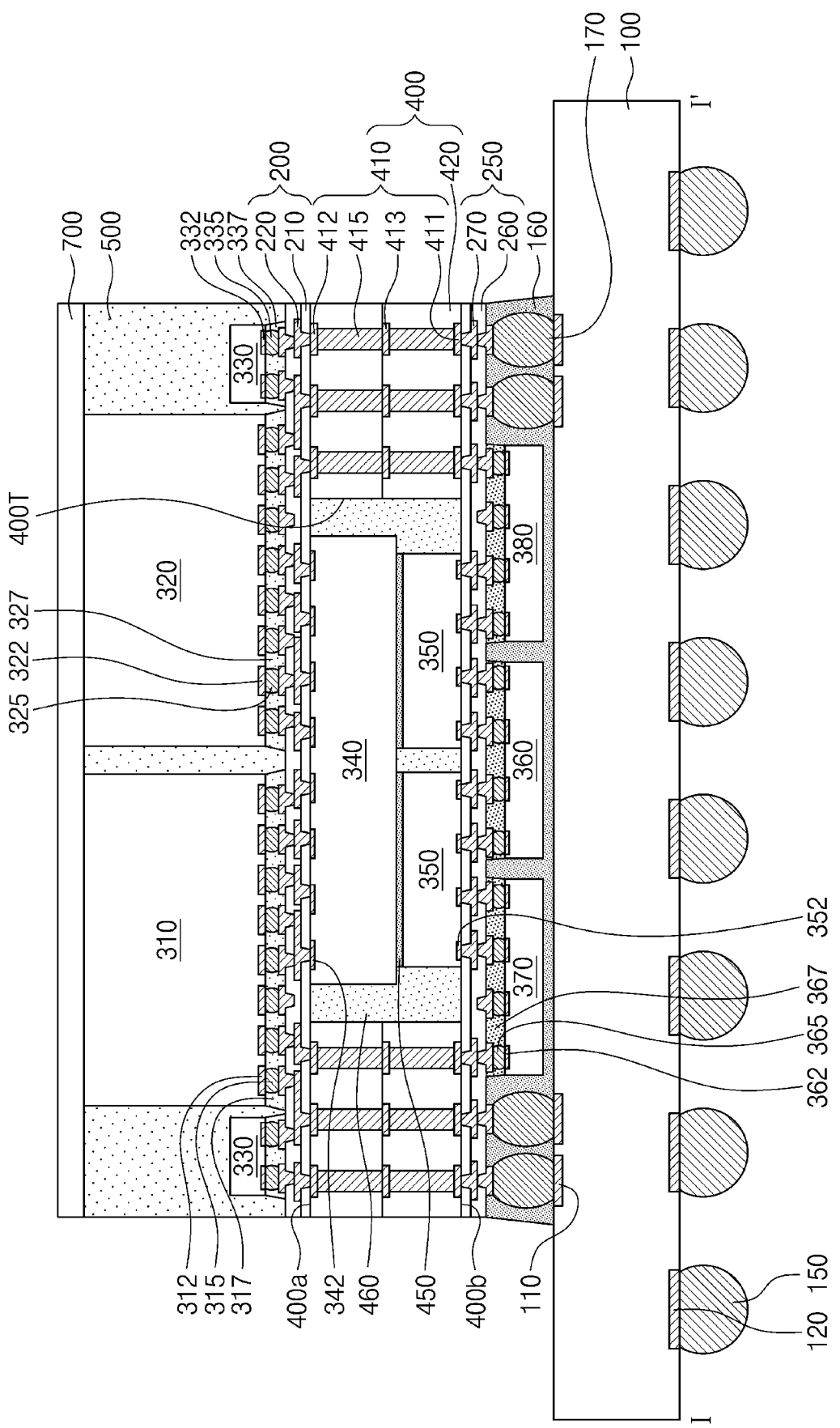
FIG. 12 is a sectional view taken along the line I-I' of FIG. 1 to illustrate a semiconductor package according to an exemplary embodiment of the present inventive concept.

FIG. 12 is a sectional view taken along the line I-I' of FIG. 1 to illustrate a semiconductor package according to an exemplary embodiment of the present inventive concept.

Referring to FIGS. 1 and 12, the semiconductor package 10 may further include a mold layer 500 and a heat-dissipation plate 700, in addition to the package substrate 100, the first re-distribution layer 200, the second re-distribution layer 250, the connection substrate 400, the first semiconductor chip 310, the first connection chip 340, the second connection chip 350, the first lower semiconductor chip 360, second lower semiconductor chip 370, and the third lower semiconductor chip 380. To the extent that various elements are not described in detail with respect to FIG. 12, it may be assumed that these elements are at least similar to corresponding elements described in detail elsewhere within the instant application. Corresponding elements may have similar or identical reference numerals or may otherwise be recognizable as corresponding based on context.

The mold layer 500 may be provided on the package substrate 100 to cover the first re-distribution layer 200. The mold layer 500 may be disposed on the first redistribution layer. For example, the mold layer 500 may cover the top surface of the first re-distribution layer 200, the side surfaces of the first semiconductor chip 310, the side surfaces of the second semiconductor chip 320, and the passive devices 330. In an exemplary embodiment of the present inventive concept, the mold layer 500 may be exposed near the top surfaces of the first and second semiconductor chips 310 and 320. For example, the mold layer 500 may include an insulating polymer (e.g., epoxy molding compound (EMC)).

The heat-dissipation plate 700 may be provided on the package substrate 100 to cover the mold layer 500. The heat-dissipation plate 700 may be disposed on the mold layer 500. The heat-dissipation plate 700 may cover the top surface of at least one of the first and second semiconductor chips 310 and 320. The heat-dissipation plate 700 may include, for example, a heat slug or a heat sink. The heat-dissipation plate 700 may be formed of or include, for example, a metallic material having high thermal conductivity.

Figure 13:
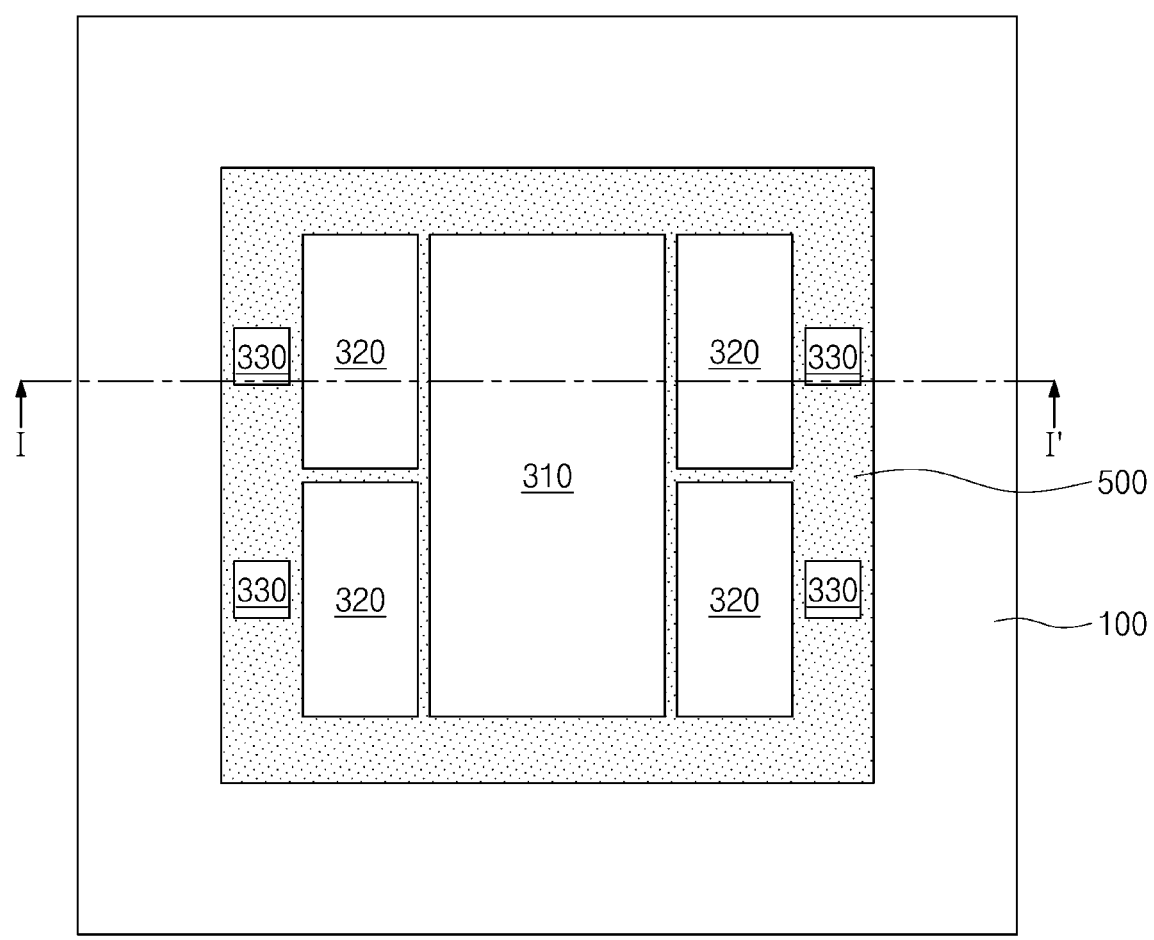
FIG. 13 is a plan view illustrating a semiconductor package according to an exemplary embodiment of the present inventive concept.
Figure 14:
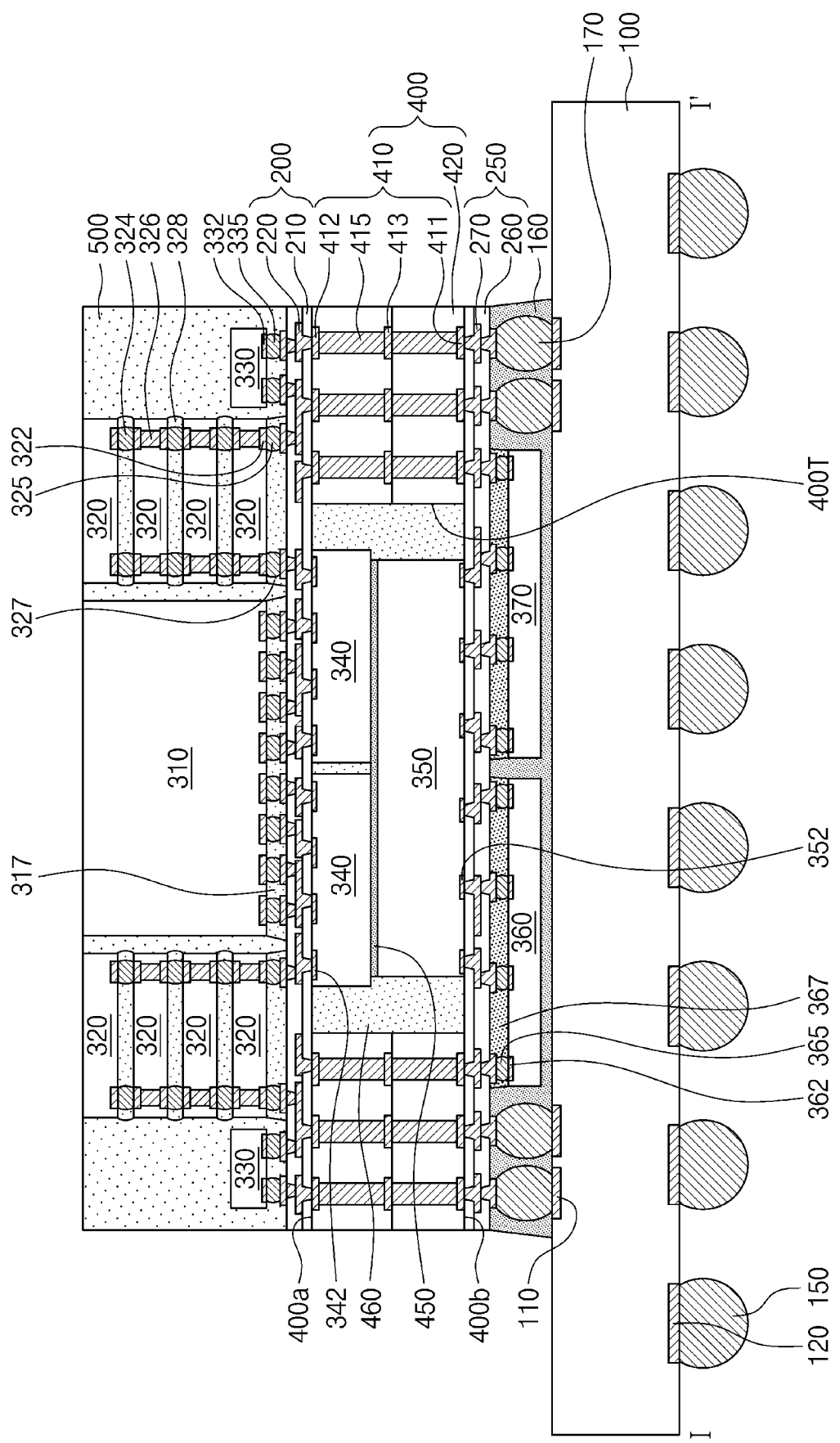
FIG. 14 is a sectional view taken along the line I-I' of FIG. 13 to illustrate a semiconductor package according to an exemplary embodiment of the present inventive concept.

FIG. 13 is a plan view illustrating a semiconductor package according to an exemplary embodiment of the present inventive concept. FIG. 14 is a sectional view taken along the line I-I' of FIG. 13 to illustrate a semiconductor package according to an exemplary embodiment of the present inventive concept.

Referring to FIGS. 13 and 14, a semiconductor package 20 may further include a chip stack, in addition to the package substrate 100, the first re-distribution layer 200, the second re-distribution layer 250, the connection substrate 400, the first semiconductor chip 310, the first connection chip 340, the second connection chip 350, the first lower semiconductor chip 360, and the second lower semiconductor chip 370. To the extent that various elements are not described in detail with respect to FIGS. 13 and 14, it may be assumed that these elements are at least similar to corresponding elements described in detail elsewhere within the instant application. Corresponding elements may have similar or identical reference numerals or may otherwise be recognizable as corresponding based on context.

The first semiconductor chip 310 may be mounted on the top surface of the first re-distribution layer 200. The first semiconductor chip 310 may include, for example, a logic chip, a buffer chip, or a system-on-chip (SOC). For example, the first semiconductor chip 310 may be an application-specific integrated circuit (ASIC) chip or an application processor (AP) chip. The ASIC chip may include an application specific integrated circuit (ASIC). The first semiconductor chip 310 may include, for example, a central processing unit (CPU) or a graphic processing unit (GPU).

A plurality of second semiconductor chips 320 may be mounted on the first re-distribution layer 200. For example, the plurality of second semiconductor chips 320 may be mounted on the top surface of the re-distribution layer 200. The second semiconductor chips 320 may be spaced apart from the first semiconductor chip 310. For example, the second semiconductor chips 320 may be horizontally spaced apart from the first semiconductor chip 310. The second semiconductor chips 320 may be vertically stacked on the first re-distribution layer 200 to form a chip stack. In an exemplary embodiment of the present inventive concept, a plurality of the chip stacks may be provided. The second semiconductor chips 320 may be a type different from that of the first semiconductor chip 310. For example, the second semiconductor chips 320 may be memory chips. The memory chips may include high bandwidth memory (HBM) chips. For example, the second semiconductor chips 320 may include DRAM chips. However, the numbers of the chip stack, the first semiconductor chip 310, and the second semiconductor chips 320 may be variously changed.

The first semiconductor chip 310 may include the first chip pads 312, which are adjacent to the bottom surface of the first semiconductor chip 310. The second semiconductor chips 320 may include the second chip pads 322, which are adjacent to the top and bottom surfaces of the second semiconductor chips 320. However, in an exemplary embodiment of the present inventive concept, the second chip pads 322 may not be provided on the top surface of the uppermost one of the second semiconductor chips 320.

Each of the second semiconductor chips 320 may include integrated circuits and through vias 326. The integrated circuits may be provided in the second semiconductor chips 320. The through vias 326 may be provided to penetrate a corresponding one of the second semiconductor chips 320 and may be electrically connected to the integrated circuits. The through vias 326 may be formed of or include at least one of a plurality of conductive materials (e.g., copper (Cu), aluminum (Al), tungsten (W), and titanium (Ti)). However, in an exemplary embodiment of the present inventive concept, the topmost ones of the second semiconductor chips 320 might not include the through vias 326.

Upper chip bumps 324 may be interposed between two adjacent ones of the second semiconductor chips 320. The upper chip bumps 324 may be electrically connected to the through vias 326 of a corresponding one of the second semiconductor chips 320. The second semiconductor chips 320 may be electrically connected to each other by the upper chip bumps 324.

An upper chip under-fill layer 328 may be interposed between two adjacent ones of the second semiconductor chips 320. The upper chip under-fill layer 328 may be provided to fill a space between the upper chip bumps 324 and to hermetically seal or encapsulate the upper chip bumps 324. In an exemplary embodiment of the present inventive concept, the upper chip under-fill layer 328 may include a non-conductive film (NCF), such as an Ajinomoto build-up film (ABF).

A plurality of first connection chips 340 may be mounted on the bottom surface of the first re-distribution layer 200. The first connection chips 340 may be horizontally spaced apart from each other. The second connection chip 350 may be mounted on the top surface of the second re-distribution layer 250. For example, the second connection chip 350 may be disposed between the first connection chips 340 and the second re-distribution layer 250. When viewed in a plan view, the second connection chip 350 may be disposed between the first connection chips 340. A portion of the second connection chip 350 may be vertically overlapped with one of the first connection chips 340, and another portion of the second connection chip 350 may be vertically overlapped with another of the first connection chips 340. The adhesive pattern 450 may be interposed between the first connection chips 340 and the second connection chip 350. The adhesive pattern 450 may cover the top surface of the second connection chip 350.

The first lower semiconductor chip 360 and the second lower semiconductor chip 370 may be mounted on the bottom surface of the second re-distribution layer 250. The first lower semiconductor chip 360 and the second lower semiconductor chip 370 may be horizontally spaced apart from each other. A portion of the first lower semiconductor chip 360 may be vertically overlapped with the second connection chip 350, and another portion of the first lower semiconductor chip 360 may be vertically overlapped with the connection substrate 400. A portion of the second lower semiconductor chip 370 may be vertically overlapped with the second connection chip 350, and another portion of the second lower semiconductor chip 370 may be vertically overlapped with the connection substrate 400.

The mold layer 500 may be provided on the package substrate 100 to cover the first re-distribution layer 200. The mold layer 500 may cover the top surface of the first re-distribution layer 200, the side surfaces of the first semiconductor chip 310, the side surfaces of the second semiconductor chip 320, and top and side surfaces of the passive devices 330. In an exemplary embodiment of the present inventive concept, the mold layer 500 may expose the top surfaces of the first and second semiconductor chips 310 and 320. For example, the mold layer 500 may include an insulating polymer (e.g., epoxy molding compound (EMC)).

In an exemplary embodiment of the present inventive concept, the semiconductor package 10 might not include the upper under-fill layer interposed between the passive device 330 and the first re-distribution layer 200.

Planar arrangements of the first and second semiconductor chips 310 and 320, the passive device 330, the first connection chip 340, the second connection chip 350, and the first and second lower semiconductor chips 360 and 370 are not necessarily limited to the illustrated example and may be variously changed.

According to an exemplary embodiment of the present inventive concept, since first and second connection chips, which are opposite to each other, are disposed between first and second re-distribution layers, semiconductor chips may be mounted on a top surface of the first re-distribution layer, and lower semiconductor chips may be mounted on a bottom surface of the second re-distribution layer. Accordingly, it may be possible to reduce a length of an electric connection path between the semiconductor chips and thereby to increase a signal transmission speed and stability of the signal transmission. As a result, it may be possible to improve electric characteristics of a semiconductor package.

According to an exemplary embodiment of the present inventive concept, since a length of an electric connection path between a semiconductor chip and a passive device is reduced, it may be possible to effectively remove a noise of a power signal or an input signal and to increase a power integrity property of a semiconductor package.

According to an exemplary embodiment of the present inventive concept, it may be possible to increase a degree of freedom in disposing semiconductor chips and to mount semiconductor chips in a high density, and thus, a highly-integrated and small semiconductor package may be provided.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor package, comprising:
a package substrate;
a first re-distribution layer disposed on the package substrate;
a second re-distribution layer disposed between the package substrate and the first re-distribution layer;
a connection substrate interposed between the first re-distribution layer and the second re-distribution layer, wherein a connection hole penetrates the connection substrate;
a first semiconductor chip mounted on a first surface of the first re-distribution layer;
a first connection chip mounted on a second surface, opposite to the first surface, of the first re-distribution layer and disposed in the connection hole;
a second connection chip mounted on a first surface of the second re-distribution layer and disposed in the connection hole; and
a first lower semiconductor chip mounted on a second surface, opposite to the first surface, of the second re-distribution layer.

2. The semiconductor package of claim 1, wherein the first re-distribution layer comprises a first redistribution pattern,
wherein the second re-distribution layer comprises a second redistribution pattern,
wherein the first connection chip comprises a first connection pad disposed on a first surface of the first connection chip,
wherein the second connection chip comprises a second connection pad disposed on a first surface of the second connection chip,
wherein the first redistribution pattern is electrically connected to the first connection pad of the first connection chip, and
wherein the second redistribution pattern is electrically connected to the second connection pad of the second connection chip.

3. The semiconductor package of claim 1, further comprising an adhesive pattern interposed between the first connection chip and the second connection chip.

4. The semiconductor package of claim 1, wherein the first re-distribution layer comprises a first insulating layer and first redistribution patterns disposed in the first insulating layer,
wherein the second re-distribution layer comprises a second insulating layer and second redistribution patterns disposed in the second insulating layer,
wherein each of the first redistribution patterns comprises a first via portion and a first wire portion, and
wherein each of the second redistribution patterns comprises a second wire portion and a second via portion.

5. The semiconductor package of claim 1, wherein the second connection chip is a plurality of second connection chips, which are spaced apart from each other, and
wherein the first lower semiconductor chip is disposed between the plurality of second connection chips, when viewed in a plan view.

6. The semiconductor package of claim 5, further comprising:
a second lower semiconductor chip mounted on the second surface of the second re-distribution layer and spaced apart from the first lower semiconductor chip; and
a third lower semiconductor chip mounted on the second surface of the second re-distribution layer and spaced apart from the second lower semiconductor chip, wherein the first lower semiconductor chip is interposed between the second lower semiconductor chip and the third lower semiconductor chip.

7. The semiconductor package of claim 6, wherein the second lower semiconductor chip is electrically connected to a first-second connection chip of the plurality of second connection chips and the connection substrate, and
wherein the third lower semiconductor chip is electrically connected to a second-second connection chip of the plurality of second connection chips and the connection substrate.

8. The semiconductor package of claim 1, further comprising a second semiconductor chip mounted on the first surface of the first re-distribution layer and spaced apart from the first semiconductor chip,
wherein a first portion of the first connection chip is overlapped with a portion of the first semiconductor chip, and
wherein a second portion of the first connection chip is overlapped with a portion of the second semiconductor chip.

9. The semiconductor package of claim 1, further comprising a passive device spaced apart from the first semiconductor chip.

10. The semiconductor package of claim 1, further comprising a connection mold layer provided in the connection hole of the connection substrate and interposed between the first re-distribution layer and the second re-distribution layer.

11. A semiconductor package, comprising:
a package substrate;
a first re-distribution layer disposed on the package substrate;
a second re-distribution layer disposed between the package substrate and the first re-distribution layer;
a first semiconductor chip mounted on a top surface of the first re-distribution layer;
a first connection chip mounted on a bottom surface, opposite to the top surface, of the first re-distribution layer;
a second connection chip mounted on a top surface of the second re-distribution layer;
a first lower semiconductor chip mounted on a bottom surface, opposite to the top surface, of the second re-distribution layer and disposed between the package substrate and the second re-distribution layer; and
an adhesive pattern interposed between the first connection chip and the second connection chip.

12. The semiconductor package of claim 11, further comprising a substrate under-fill layer interposed between the package substrate and the second re-distribution layer,
wherein the first lower semiconductor chip is disposed in the substrate under-fill layer, and
wherein the first lower semiconductor chip is spaced apart from the package substrate.

13. The semiconductor package of claim 11, further comprising:
a second lower semiconductor chip mounted on the bottom surface of the second re-distribution layer and spaced apart from the first lower semiconductor chip;
a third lower semiconductor chip mounted on the bottom surface of the second re-distribution layer and spaced apart from the second lower semiconductor chip, wherein the first lower semiconductor chip is interposed between the second lower semiconductor chip and the third lower semiconductor chip; and a connection substrate, wherein a portion of the second lower semiconductor chip is overlapped with the connection substrate, and wherein a portion of the third lower semiconductor chip is overlapped with the connection substrate.

14. The semiconductor package of claim 11, wherein the first connection chip comprises first connection pads provided on a first surface of the first connection chip, and wherein a pitch of the first connection pads ranges from about 40 μm to about 150 μm.

15. The semiconductor package of claim 11, wherein the second connection chip comprises a plurality of second connection pads provided on a first surface of the second connection chip, and a pitch of the plurality of second connection pads ranges from about 100 μm to about 300 μm.

16. The semiconductor package of claim 11, wherein the first lower semiconductor chip comprises an active device or a passive device.

17. The semiconductor package of claim 11, further comprising a chip stack mounted on the top surface of the first re-distribution layer and spaced apart from the first semiconductor chip, and wherein the chip stack comprises a plurality of second semiconductor chips stacked on one another.

18. A semiconductor package, comprising:

a package substrate;

a first re-distribution layer disposed on the package substrate;

a second re-distribution layer disposed between the package substrate and the first re-distribution layer;

a connection substrate interposed between the first re-distribution layer and the second re-distribution layer, wherein a connection hole penetrates the connection substrate;

a first semiconductor chip mounted on a first surface of the first re-distribution layer;

a second semiconductor chip mounted on the first surface of the first re-distribution layer and spaced apart from the first semiconductor chip;

a first connection chip mounted on a second surface, opposite to first surface, of the first re-distribution layer and disposed in the connection hole;

a second connection chip mounted on a first surface of the second re-distribution layer and disposed in the connection hole;

a substrate under-fill layer interposed between the package substrate and the second re-distribution layer;

a first lower semiconductor chip mounted on a second surface, opposite to the first surface, of the second re-distribution layer and disposed in the substrate under-fill layer; and a second lower semiconductor chip mounted on the second surface of the second re-distribution layer and spaced apart from the first lower semiconductor chip.

19. The semiconductor package of claim 18, wherein the first semiconductor chip comprises a chip that is a type different from that of the second semiconductor chip.

20. The semiconductor package of claim 18, wherein the connection substrate comprises a base layer and a conductive structure disposed in the base layer, and wherein the conductive structure is electrically connected to the first re-distribution layer and the second re-distribution layer.

* * * * *